United States Patent
Chen et al.

(10) Patent No.: US 9,449,204 B1
(45) Date of Patent: Sep. 20, 2016

(54) ANTI-RECORDING CARD READING DEVICE

(71) Applicant: UNIFORM INDUSTRIAL CORP., New Taipei (TW)

(72) Inventors: Yu-Tsung Chen, New Taipei (TW); Jian-Jie Wang, New Taipei (TW)

(73) Assignee: UNIFORM INDUSTRIAL CORP., New Taipei (TW)

( * ) Notice: Subject to any disclaimer, the term of this patent is extended or adjusted under 35 U.S.C. 154(b) by 0 days.

(21) Appl. No.: 14/721,301

(22) Filed: May 26, 2015

(30) Foreign Application Priority Data

Mar. 27, 2015 (TW) .............................. 104204735 U

(51) Int. Cl.
| | |
|---|---|
| *G06K 7/06* | (2006.01) |
| *G06K 7/08* | (2006.01) |
| *H01P 3/02* | (2006.01) |
| *H05K 1/02* | (2006.01) |

(52) U.S. Cl.
CPC .............. *G06K 7/084* (2013.01); *H01P 3/026* (2013.01); *H05K 1/0213* (2013.01)

(58) Field of Classification Search
CPC ................. H01L 2924/0002; H01L 2924/00; G02F 1/1345; G02F 1/13452; G02F 2001/13456; G06F 21/445; G06F 21/82; G06F 21/86; G06K 19/07381; G06K 7/0013; G06K 7/0091; G06K 7/084; G07F 7/005; G07F 7/0813; H01P 3/026; H05K 1/0213
USPC .......................... 235/475, 439, 486, 487, 492
See application file for complete search history.

(56) References Cited

U.S. PATENT DOCUMENTS

| | | | | |
|---|---|---|---|---|
| 2006/0012745 | A1* | 1/2006 | Kobayashi | G02F 1/13452 349/152 |
| 2009/0302109 | A1* | 12/2009 | Kerner | G06K 7/0091 235/439 |
| 2010/0225424 | A1* | 9/2010 | Yeates | H01P 3/08 333/238 |
| 2012/0043958 | A1* | 2/2012 | Chen | G06K 19/07381 324/76.11 |
| 2013/0103190 | A1* | 4/2013 | Carapelli | G06F 21/82 700/237 |
| 2013/0300453 | A1* | 11/2013 | Carapelli | H03K 19/003 326/8 |
| 2015/0230331 | A1* | 8/2015 | Lee | H05K 1/0259 361/220 |

* cited by examiner

*Primary Examiner* — Thien M Le
(74) *Attorney, Agent, or Firm* — Muncy, Geissler, Olds & Lowe, P.C.

(57) ABSTRACT

This anti-recording card reading device includes: a magnetic card reading head having a data reading terminal and a flexible circuit board, where the flexible circuit board has a plurality of ear-fold portions, a first line layer of the flexible circuit board is provided with a signal transmission line, a first protection line is disposed on two sides of the signal transmission line, a second line layer is provided with a second protection line, and the ear-fold portions can be fold and fitted in the magnetic card reading head; a mainboard, disposed neighboring to a card reading component; an anti-tamper framework, disposed on the mainboard; and a protection area bounded by the anti-tamper framework, where a terminal section of the flexible circuit board is connected to the data reading terminal, and the other side extends into the protection area and is connected to the mainboard.

12 Claims, 10 Drawing Sheets

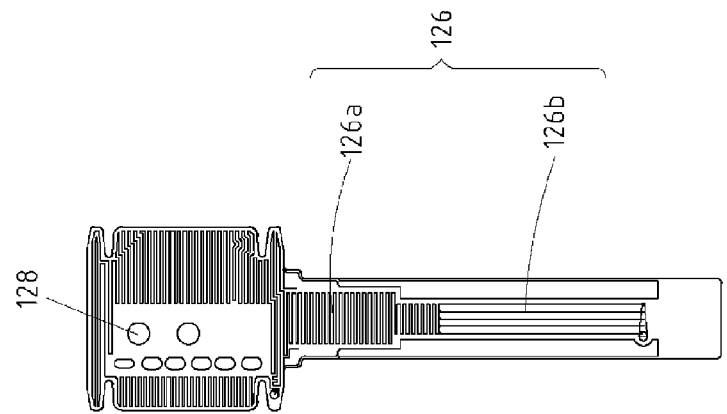
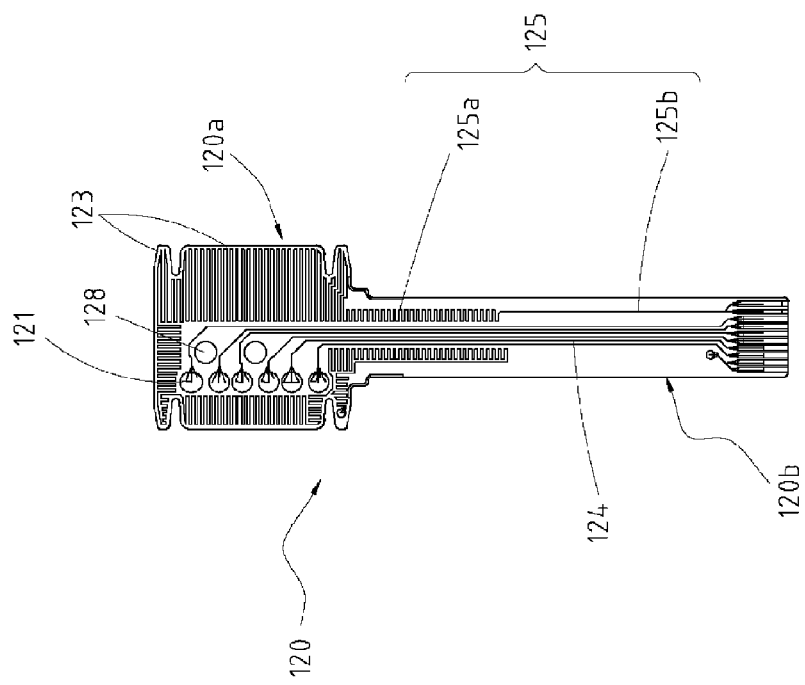
FIG. 2a
FIG. 2b

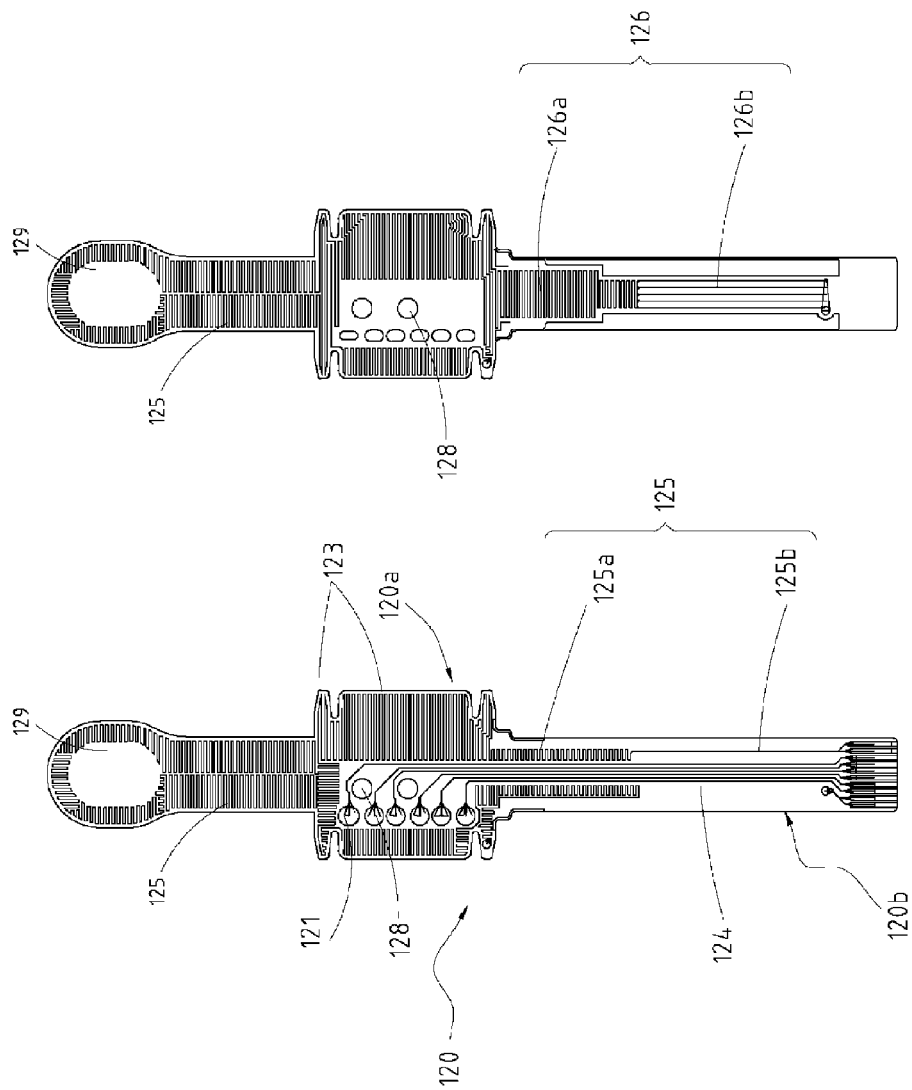

ANTI-RECORDING CARD READING DEVICE

CROSS-REFERENCES TO RELATED APPLICATIONS

This non-provisional application claims priority under 35 U.S.C. §119(a) on Patent Application No. 104204735 filed in Taiwan, R.O.C. on 2015 Mar. 27, the entire contents of which are hereby incorporated by reference.

BACKGROUND

1. Technical Field

The present invention relates to a card reading device, and in particular, to an anti-recording card reading device.

2. Related Art

At present, various card readers that include multiple functions are applied to fields such as credit cards, access control cards, and the like. For credit cards, with the rising popularity of the credit cards, the security issue faced by personal credit data is increasingly severe, in which the practice of recording credit card data and illegally manufacturing a false card is the most common. Therefore, how to prevent credit data from being stolen and avoiding occurrence of a capital loss and disruption of the financial order is a public problem.

In common recording methods, the practice of intruding into a magnetic card reading head, a transmission circuit, or a card reader, then connecting to a signal transmission node, and implanting a chip to intercept client information is the most difficult to prevent. In addition, because it looks the same as a normal card swiping machine and no abnormality exists in the card swiping procedure, it is not easy for a card holder to pay attention thereto. Therefore, how to prevent a card reader from being damaged to implant a pirate chip is a problem that urgently needs to be solved by research personnel in related arts.

SUMMARY

In view of the problems above, the present invention is directed to provide an anti-recording card reading device, so as to prevent a card reader from being damaged and even having a pirate chip implanted.

An embodiment of the present invention provides an anti-recording card reading device, including: a magnetic card reading head having a data reading terminal and a flexible circuit board, where the flexible circuit board has a plurality of ear-fold portions, a first line layer of the flexible circuit board is provided with a signal transmission line and a first protection line, a second line layer is provided with a second protection line, and the ear-fold portions can be fold and received and fitted in the magnetic card reading head; a mainboard, disposed neighboring to a card reading component; an anti-tamper framework, disposed on the mainboard; and a protection area bounded by the anti-tamper framework, where a terminal section on one side of the flexible circuit board is connected to the data reading terminal, and a line section on the other side of the flexible circuit board extends into the protection area and is connected to the mainboard. When the magnetic card reading head, the flexible circuit board, or the anti-tamper framework is damaged by external force, the laid protection lines are triggered to enable signal loop disconnection or short circuit of a loop protection program. In addition, the flexible circuit board enters the protection area of the anti-tamper framework after extending out of the magnetic card reading head, thereby reducing exposure and further reducing a connection possibility.

After the magnetic card reading head is placed in the flexible circuit board, a sealing glue (for example, epoxy resin) is injected to fill the gap, which can prevent connection to the data reading terminal. The ear-fold portions of the flexible circuit board are also provided with a protection line, and are folded and fitted and received in the magnetic card reading head, so that the magnetic card reading head is protected all around, preventing connection to a signal line by means of intrusion from the periphery. In addition, the flexible circuit board has a through hole, so that during sealing glue injection, the sealing glue can completely coat the flexible circuit board placed in the magnetic card reading head.

The flexible circuit board may include a terminal section, where one end of the terminal section extends out of the line section, and the other end of the terminal section may also extend to a protection line section. The first protection line and the second protection line are evenly distributed on the entire flexible circuit board, so as to prevent connection to a signal line, and enhance a fixing effect.

BRIEF DESCRIPTION OF THE DRAWINGS

FIG. 2a is a line distribution diagram (1) of a flexible circuit board according to an embodiment of the present invention;

FIG. 2b is a line distribution diagram (2) of a flexible circuit board according to an embodiment of the present invention;

FIG. 7a is a line distribution diagram (1) of a flexible circuit board according to another embodiment of the present invention; and FIG. 7b is a line distribution diagram (2) of a flexible circuit board according to another embodiment of the present invention.

DETAILED DESCRIPTION

Figure 1A:
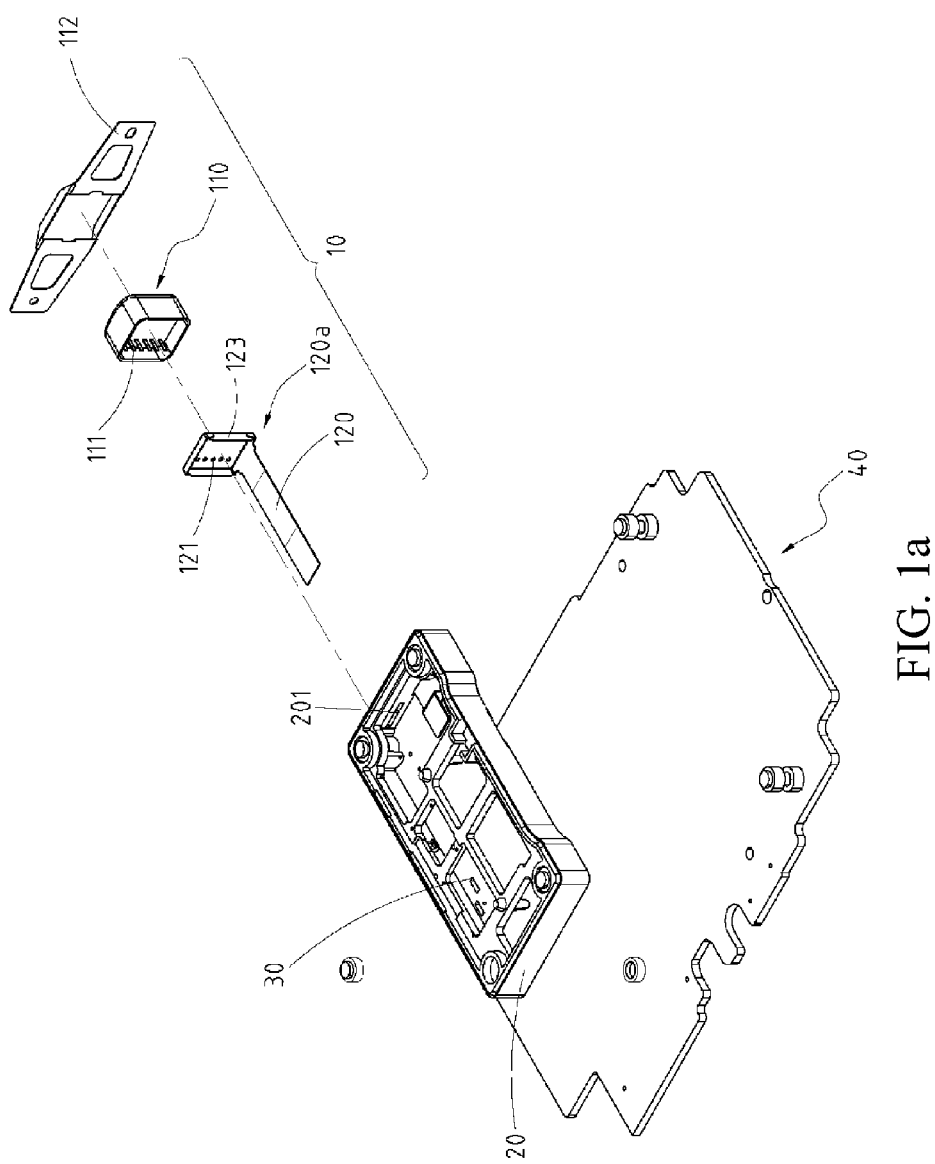
FIG. 1a is an exploded view of an essential structure according to an embodiment of the present invention.
Figure 1B:
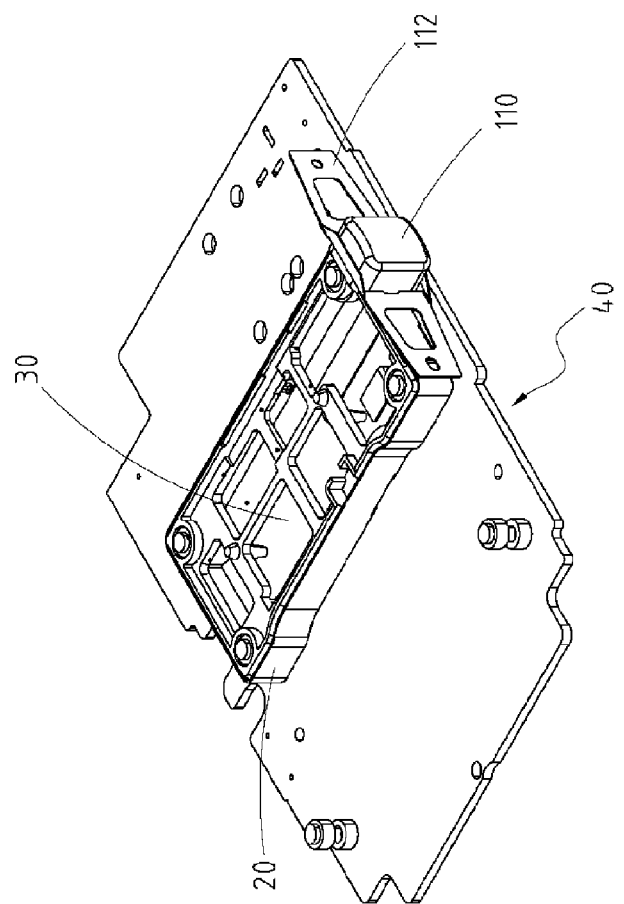
FIG. 1b is an assembly diagram of an essential structure according to an embodiment of the present invention.

Referring to FIG. 1a, FIG. 1b, FIG. 2a, and FIG. 2b, an embodiment of the present invention provides an anti-recording card reading device, including: a card reading component 10, including: a magnetic card reading head 110, having at least one data reading terminal 111; and a flexible circuit board 120, having a plurality of ear-fold portions 123, where one surface of the flexible circuit board 120 is provided with a signal transmission line 124, the signal transmission line 124 is provided with a first protection line 125 around, a back surface is provided with a second protection line 126, and the ear-fold portion 123 can be folded and fitted and received in the magnetic card reading head 110; a mainboard 40, disposed neighboring to the card reading component 10, where an anti-tamper framework 20 is disposed on the mainboard 40; and a protection area 30, which is an area bounded by the anti-tamper framework 20, where a terminal section 120a of the flexible circuit board 120 is connected to the at least one data reading terminal 111, and the other end extends into the protection area 30 and is connected to the mainboard 40.

In another embodiment of the present invention, to smooth the manufacturing process, the flexible circuit board 120 may be of two layers, a first line layer is provided with a signal transmission line 124 and a first protection line 125 is disposed on two sides of the signal transmission line 124, and a second line layer is provided with a second protection line 126 corresponding to the signal transmission line 124, where a terminal section 120a of the signal transmission line 124 includes at least one connecting terminal 121, which corresponds to and can be electrically connected to the data reading terminal 111.

The card reading component 10 basically includes the magnetic card reading head 110 and the flexible circuit board 120, where the magnetic card reading head is provided with the data reading terminal 111, to obtain information in a card when the card is swiped, and is electrically connected to the data reading terminal 111 by using the connecting terminal 121 on the flexible circuit board 120, to transfer the obtained information in the card by using the signal transmission line 124 to a micro processor not shown disposed on the mainboard 40 for subsequent use, for example, authorization is obtained for swiping of a credit card, a door is opened after an access control card is swiped, or a consumption record is saved after a membership card is swiped.

The anti-tamper framework 20 may construct its anti-tamper property by using an anti-tamper screw or an anti-tamper buckling piece, disposing an anti-tamper protection circuit, mounting an anti-tamper power-off sensing element, or the like, and specifically may use a multi-layered circuit board, which is provided with a plurality of winding wire meshes, where when the winding wire meshes are intruded into, a loop protection program is started, the loop protection program can enable signal loop disconnection or short circuit, or make the micro processor on the mainboard stop running. The mainboard further includes a plurality of contacts, the anti-tamper framework includes a plurality of conducting pieces, to connect to the contacts, and when the conducting pieces are connected to the contacts, the anti-recording card reading device is in signal loop on state. The anti-tamper framework 20 on the mainboard 40 forms a protection area 30, to receive the micro processor and memory for processing or storing information in a card. With the anti-tamper property constructed by using the foregoing technical means, information confidentiality can be achieved, and if disassembly is performed by external force, short circuit of the mainboard is caused, and the mainboard cannot run.

Figure 3:
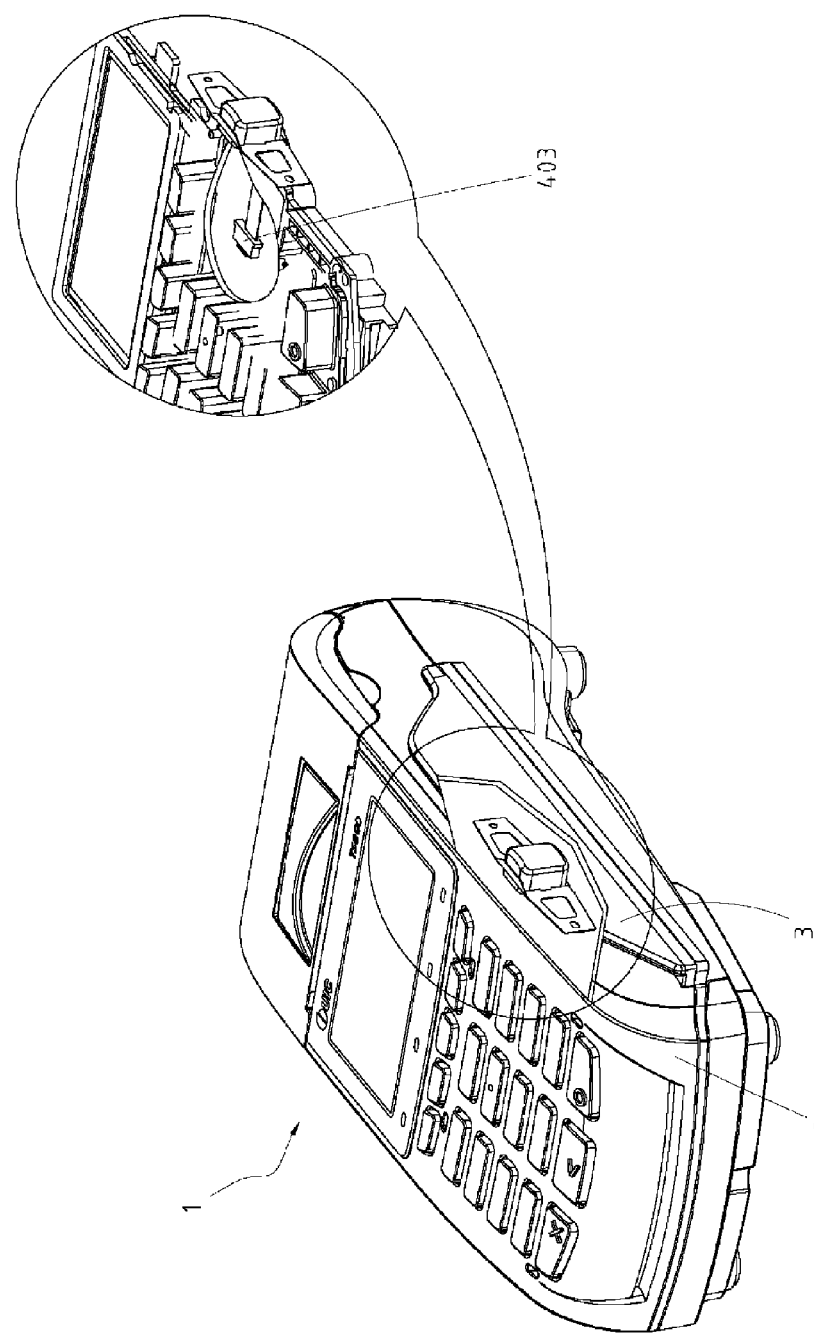
FIG. 3 is a schematic diagram of appearance of a card reader and an inside view in which some parts are magnified according to an embodiment of the present invention.
Figure 4:
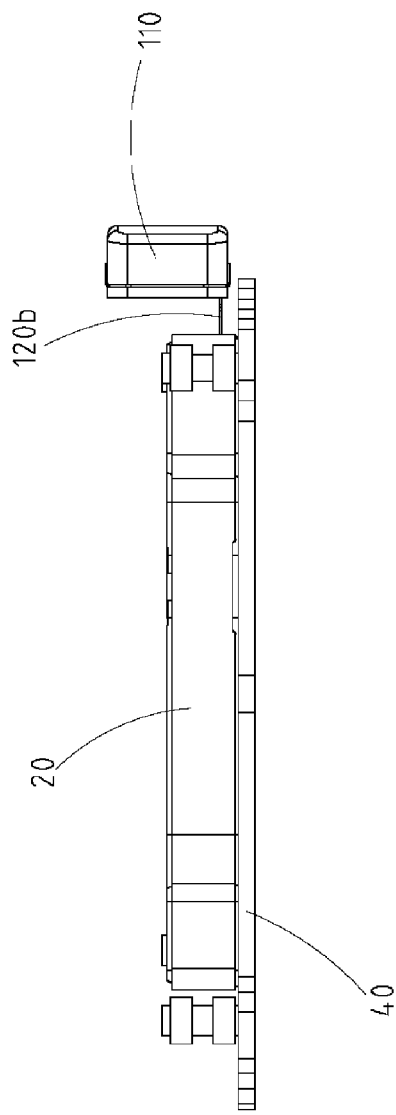
FIG. 4 is a schematic side view of a card reader according to an embodiment of the present invention.

Referring to FIG. 3, the mainboard further includes a bayonet socket 403, which is connected to the other side of the flexible circuit board 120, that is, a tail end of a line section 120b. Further referring to FIG. 1a, the anti-tamper framework includes a jack 201, where the line section 120b of the flexible circuit board 120 is inserted in the jack. The terminal section 120a of the flexible circuit board 120 is received and fitted in the magnetic card reading head 110, the other side passes through the jack 201 on the anti-tamper framework 20, enters the protection area 30, and is connected to the bayonet socket 403 on the mainboard, as shown in FIG. 4. After the data reading terminal 111 of the magnetic card reading head 110 reads card information through a card swiping action, the card information is transferred by the signal transmission line 124 on the flexible circuit board 120, and the bayonet socket on the mainboard transfers the card information to a macro processor (not shown).

Figure 2C:
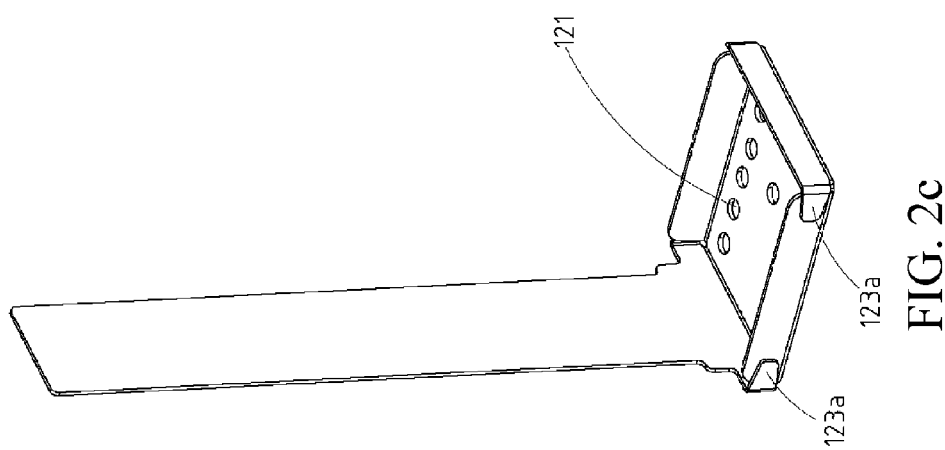
FIG. 2c is a diagram of folding of an ear-folded portion of a flexible circuit board according to an embodiment of the present invention.

FIG. 2a to FIG. 2c are line distribution diagrams and structural diagrams of a flexible circuit board according to an embodiment of the present invention.

Referring to FIG. 2a, one surface, which is referred to as a front surface below, of the flexible circuit board 120 is provided with a signal transmission line 124. The number of the signal transmission lines 124 may be determined depending on the number of the data reading terminals 111 in the magnetic card reading head 110. In an embodiment of the present invention, six data reading terminals 111 are used as an example. Therefore, it can be seen in FIG. 2a that the front surface of the flexible circuit board 120 is provided with six signal transmission lines 124, the signal transmission lines 124 extend from one side on which a connecting terminal 121 is disposed to the other side of the flexible circuit board 120 and are laid in a straight line shape, and then are connected to the micro processor on the mainboard 40 by using the bayonet socket 403.

In this embodiment, besides the signal transmission lines 124, the front surface of the flexible circuit board 120 (or a first line layer in another embodiment) is provided with a first protection line 125 around, where the first protection line 125 is laid on two sides of the signal transmission lines of the flexible circuit board. The first protection line is partially intensively laid in an S shape on the surface, and partially laid in a straight line shape. Because a winding part 125a of the first protection line is laid in an S shape in the terminal section 120a, received in the magnetic card reading head 110, of the entire flexible circuit board 120, the part, which is not received in the protection area 30, of the flexible circuit board 120 is thus protected. When external force is exerted and damage is tried starting from the magnetic card reading head, the winding part 125a of the first protection line is triggered to enable signal loop disconnection or short circuit of a loop protection program, thereby giving a command that reading is not allowed.

After the other end of the flexible circuit board 120 extends into the protection area 30, the first protection line turn into the linear part 125b, being disposed in a straight line shape on the front surface of the flexible circuit board 120 from being disposed in a straight line shape. Because after the flexible circuit board 120 enters the protection area 30, protection can be obtained from the protection framework 20, the first protection line 125 does not need to be disposed in a winding manner. In addition, the winding part 125a in an S shape of the first protection line is disposed on the flexible circuit board 120 by using a conductive metal. When the first protection line is intensively laid in an S shape, the rigidity definitely increases, which reduces the flexibility of the flexible circuit board 120. After quite a number of card swiping actions for a long term, if the flexibility of the flexible circuit board 120 is insufficient, it can be known from experience that, line breakage occurs on the flexible circuit board 120 due to much winding, and accordingly a fault is produced on a card reader.

Referring to FIG. 2b, the other surface of the flexible circuit board 120 (or a second line layer in another embodiment) is referred to as a back surface below. The flexible circuit board includes a second protection line 126, which is disposed on the back surface of the flexible circuit board. The second protection line is partially disposed on the surface in a winding manner, and partially disposed on the surface in a straight line shape. As described above, to increase the flexibility of the flexible circuit board 120, in terms of distribution, the second protection line 126 on the back surface is also divided into a winding part 126a of the second protection line and a straight part 126b of the second protection line. With this layout manner, the manufacturing processor of the flexible circuit can also be simplified, raw materials are reduced, and a same protection effect can be achieved.

Figure 1C:
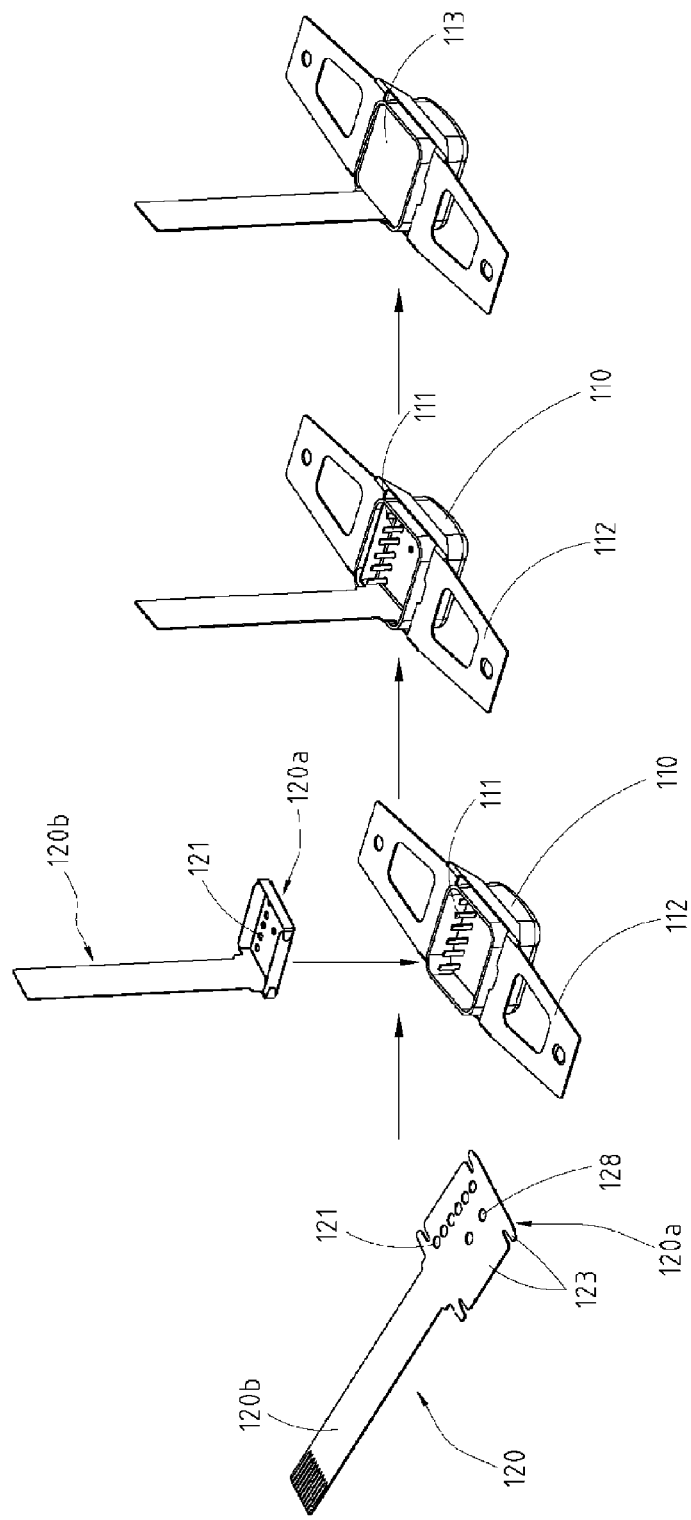
FIG. 1c is a diagram of assembly steps of a magnetic card reading head according to an embodiment of the present invention.

Referring to FIG. 1c, the magnetic card reading head 110 is in a depressed box structure, and has at least one data reading terminal 111. In this embodiment, six data reading terminals are used as an example. The ear-fold portions 123 of the flexible circuit board 120 are folded for about 90 degrees, and received in the magnetic card reading head 110, and the ear-fold portions 123 are disposed around the data reading terminal 111 and the connecting terminal 121. Referring to FIG. 2c, the flexible circuit board received in the magnetic card reading head includes a plurality of overlap areas 123a, which is located at corners of the ear-fold portions 123. Because front surfaces and back surfaces of the ear-fold portions are respectively provided with the first and second protection lines, when the ear-fold portions are folded, some overlap parts are further produced (as shown in FIG. 2c), which can provide further protection to the anti-recording card reading device.

Referring to FIG. 1c, when the flexible circuit board is received in the magnetic card reading head 110, and a sealing glue 113 is injected therein, the sealing glue permeates between the terminal section 120a and magnetic card reading head 110 through a through hole 128, and makes the terminal section 120a of the flexible circuit board 120 bond with the magnetic card reading head 110. In an embodiment of the present invention, a glutinous substance (for example, epoxy resin or silicone) is injected in and fills the gap of the depressed box structure, which can fix the flexible circuit board, protect the data reading terminal from oxidation and short circuit, prevent connection to the data reading terminal for information stealing, and improve an anti-recording function. In other words, in terms of material, after solidification, the sealing glue 113 should have high rigidity and be high temperature resistant, and can well bond with the flexible circuit board 120, so as to withstand drilling and cutting attacks.

Further referring to FIG. 2a and FIG. 2b, the flexible circuit board is further provided with at least one through hole 128. In this embodiment of the present invention, two through holes 128 are included. In the last step of the manufacturing process (as shown in FIG. 1c), in the process of injecting the sealing glue 113, the sealing glue 113 is a liquid gum at the beginning; when being injected in the magnetic card reading head 110, the sealing glue 113 can flow between the flexible circuit board 120 and the magnetic card reading head 110 through the through holes 128; and after being dried and solidified, the sealing glue 113 can completely coat the flexible circuit board 120 placed in the magnetic card reading head 110, and make the flexible circuit board 120 tightly fixed in the magnetic card reading head 110, where all the ear-fold portions 123 are coated, thereby achieving an optimal vandal resistant effect.

Generally, on the premise that the data reading function of the magnetic card reading head 110 is not damaged, to connect to the data reading terminal 111, criminal groups choose to intrude from the periphery of the magnetic card reading head 110. According to the present invention, the ear-fold portions 123 protecting the circuit are disposed around the data reading terminal 111, if it is intended to implement connection by damaging the periphery of the data reading terminal 111, it is inevitable to encounter a protection line, and once the protection line is triggered, signal loop disconnection or short circuit of the loop protection program is enabled.

Referring to FIG. 2a and FIG. 2b, in the present invention, the flexible circuit board may be in a two-layer structure in design, where a first line layer (as shown in FIG. 2a) is provided with a signal transmission line 124 and a first protection line 125, a second line layer (as shown in FIG. 2b) is provided with a second protection line 126, and the two layers bond with each other. In another embodiment, to match a manufacturing process or method, the flexible circuit board may be in a two-layer film structure sometimes, where a first layer is regarded as the foregoing front surface, a second layer is regarded as the foregoing back surface, the first layer is provided with a signal transmission line and a first protection line, a second layer is provided with a second protection line, after the two layers are disposed separately, the two layers of structures are combined in a bonding manner, to form one flexible circuit board.

Referring to FIG. 3, in an embodiment, the card reading component 10 includes an elastic support 112, which is connected to the magnetic card reading head 110, so that the card reading component can be fixed on a card swiping host 1 by using the elastic support.

Referring to FIG. 7a and FIG. 7b, in an anti-recording card reading device in another embodiment of the present invention, a flexible circuit board 120 totally includes a terminal section 120a, a line section 120b, and a protection line section 120c. In this embodiment, one end of the newly added protection line section 120c is connected to the terminal section 120a and corresponds to the line section 120b. However, the protection line section 120c is only provided with a protection line, that is, has a protection function, but has no signal transmission function. The protection line of the protection line section 120c may be a first protection line 125, a second protection line 126, or both are laid thereon. In other words, protection line section 120c may have a protection line laid on one surface, or have protection lines on both surfaces.

Figure 5:
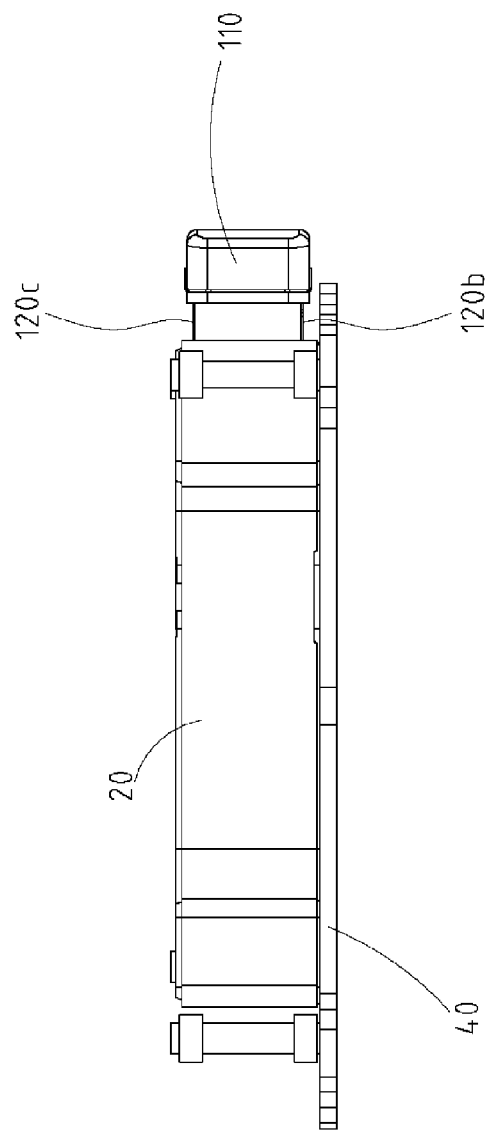
FIG. 5 is a schematic side view of a card reader according to another embodiment of the present invention.

Further referring to FIG. 5, the other end of the protection line section 120c extends into an anti-tamper framework 20, and is fixed in a protection area 30. A tail end of the protection line section 120c further includes a fixing hole 129. Further, the protection line may be disposed around the fixing hole 129, to surround the fixing hole 129. Therefore, when the flexible circuit board is pulled, the first protection line or the second protection line is damaged because the fixing hole is stuck by a fixing piece 404, and accordingly, a loop protection program is started, and the loop protection program can enable signal loop disconnection or short circuit, or make a micro processor on a mainboard stop running.

Referring to FIG. 7a and FIG. 7b, which show another manner in which the first protection line 125 is disposed around the fixing hole 129, the protection line is intensively disposed in an S shape around the fixing hole 129, to further improve the security.

Figure 6:
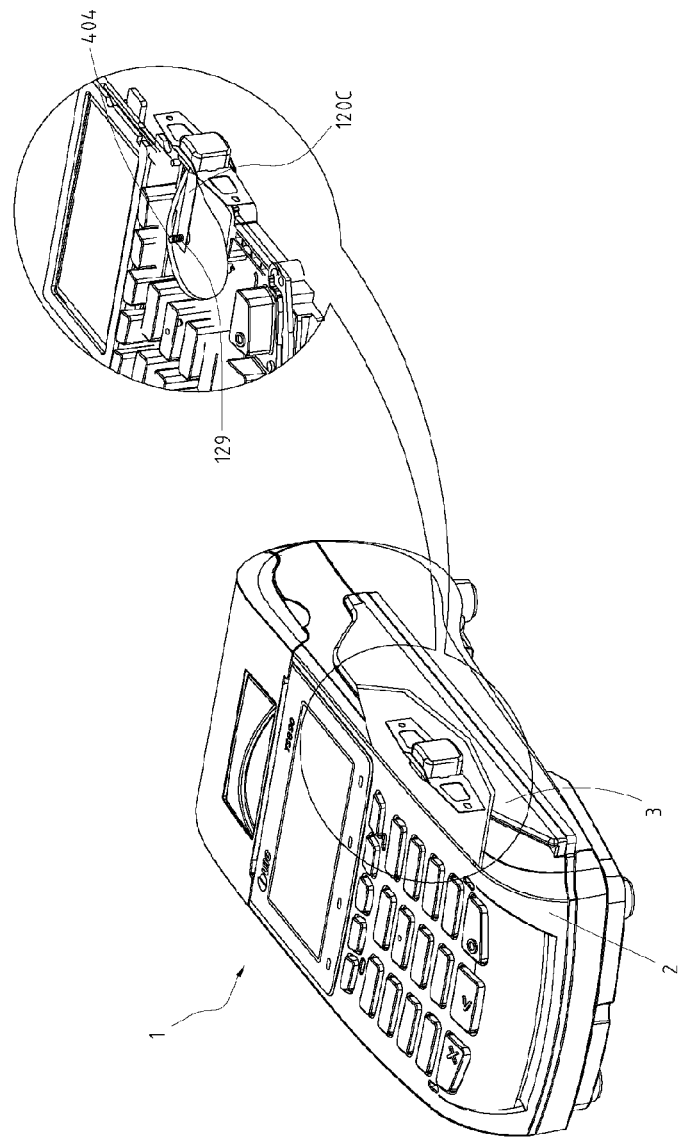
FIG. 6 is an inside view in which some parts are magnified according to another embodiment of the present invention.

Referring to FIG. 6, in this embodiment, the fixing hole 129 of the protection line section 120c can lock and fix the protection line section 120c on the anti-tamper framework 20 by using the fixing piece 404, thereby achieving a further fixing effect.

While the instant disclosure has been described by the way of example and in terms of the preferred embodiments, it is to be understood that the invention need not be limited to the disclosed embodiments. On the contrary, it is intended to cover various modifications and similar arrangements included within the spirit and scope of the appended claims, the scope of which should be accorded the broadest interpretation so as to encompass all such modifications and similar structures.

What is claimed is:

1. An anti-recording card reading device, comprising:
   a card reading component, comprising:
   a magnetic card reading head, having at least one data reading terminal; and
   a flexible circuit board, comprising: a first line layer and a second line layer, wherein the first line layer is provided with a signal transmission line and a first protection line, the first protection line is disposed on two sides of the signal transmission line, the second line layer is provided with a second protection line corresponding to the signal transmission line, and a terminal section of the flexible circuit board comprises at least one connecting terminal, which is connected to the signal transmission line and corresponds to and is electrically connected to the data reading terminal;
   a mainboard, neighboring to the card reading component;
   an anti-tamper framework, disposed on the mainboard;
   a protection area, located in an area bounded by the anti-tamper framework, wherein an end of a line section of the flexible circuit board extends into the protection area and is connected to the mainboard; and
   a sealing glue, and the sealing glue coats the terminal section in the magnetic card reading head, wherein the terminal section of the flexible circuit board has at least one through hole, and the sealing glue permeates between the terminal section and the magnetic card reading head through the through hole, and makes the terminal section bond with the magnetic card reading head.

2. The anti-recording card reading device according to claim 1, wherein the terminal section of the flexible circuit board comprises the connecting terminal and a plurality of ear-fold portions, which are fitted and received in the magnetic card reading head.

3. The anti-recording card reading device according to claim 2, wherein the ear-fold portions of the flexible circuit board are fold for about 90 degrees, and fitted in the magnetic card reading head.

4. The anti-recording card reading device according to claim 3, wherein the ear-fold portions are disposed around the connecting terminal.

5. The anti-recording card reading device according to claim 2, wherein the ear-fold portions overlap with each other to form a plurality of overlap areas.

6. The anti-recording card reading device according to claim 1, wherein one part of the first protection line is laid in an S shape, and the other part is laid in a straight line shape and extends into the protection area.

7. The anti-recording card reading device according to claim 1, wherein one part of the second protection line is laid in an S shape, and the other part is laid in a straight line shape and extends into the protection area.

8. The anti-recording card reading device according to claim 1, wherein the card reading component further comprises an elastic support, which is connected to the magnetic card reading head.

9. The anti-recording card reading device according to claim 1, wherein the mainboard further comprises a plurality of contacts, the anti-tamper framework comprises a plurality of conducting pieces, and when the conducting pieces are connected to the contacts, the anti-recording card reading device is in signal loop on state.

10. The anti-recording card reading device according to claim 1, wherein the mainboard further comprises a bayonet socket, which is connected to the line section of the flexible circuit board.

11. The anti-recording card reading device according to claim 10, wherein the anti-tamper framework comprises a jack, and the line section of the flexible circuit board is inserted in the jack to connect to the bayonet socket.

12. The anti-recording card reading device according to claim 1, wherein the flexible circuit board further comprises:
   a protection line section, having one end connected to the terminal section and corresponding to the line section, wherein the other end of the protection line section extends and is fixed in the protection area by using a fixing hole and a fixing piece, and the first protection line or the second protection line extends to be laid in the protection line section.

* * * * *